(12) United States Patent  
Suk et al.

(10) Patent No.: US 7,955,932 B2  
(45) Date of Patent: Jun. 7, 2011

(54) SINGLE ELECTRON TRANSISTOR AND METHOD OF MANUFACTURING THE SAME

(75) Inventors: Sung-Dae Suk, Seoul (KR); Kyoung-Hwan Yeo, Seoul (KR); Ming Li, Suwon-si (KR); Yun-Young Yeoh, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 508 days.

(21) Appl. No.: 11/905,758

(22) Filed: Oct. 3, 2007

(65) Prior Publication Data

US 2008/0246021 A1 Oct. 9, 2008

(30) Foreign Application Priority Data

Oct. 4, 2006 (KR) .................. 10-2006-0097507

(51) Int. Cl.
*H01L 21/336* (2006.01)
*H01L 31/00* (2006.01)

(52) U.S. Cl. .......... 438/284; 438/265; 438/962; 257/24; 257/E29.071; 257/E21.403; 257/E21.404; 257/E21.408; 977/937; 977/938

(58) Field of Classification Search .......... 257/24, 257/E29.07–E29.071, E21.403–E21.404, 257/E21.408; 438/284, 177, 265, 962; 977/937–938
See application file for complete search history.

(56) References Cited

U.S. PATENT DOCUMENTS

| 6,127,246 | A  | * | 10/2000 | Fukuda ...................... 438/478 |
| 7,002,207 | B2 |   | 2/2006  | Kim et al. |
| 7,427,788 | B2 | * | 9/2008  | Li et al. ...................... 257/287 |
| 7,452,778 | B2 | * | 11/2008 | Chen et al. ................... 438/283 |
| 2004/0097023 | A1 | * | 5/2004 | Park et al. ................... 438/149 |
| 2005/0121706 | A1 | * | 6/2005 | Chen et al. ................... 257/288 |
| 2005/0142753 | A1 | * | 6/2005 | Koh ............................. 438/257 |
| 2008/0041814 | A1 | * | 2/2008 | Romano et al. .............. 216/13 |
| 2008/0149919 | A1 | * | 6/2008 | Ernst et al. ................... 257/24 |

FOREIGN PATENT DOCUMENTS

| KR | 10-2004-0029582 |   | 12/2003 |
| KR | 10-2004-0094179 |   | 11/2004 |
| KR | 10-2005-0006634 |   | 1/2005 |
| KR | 102005010382 | A * | 1/2005 |
| KR | 10-2005-0103821 |   | 11/2005 |

* cited by examiner

*Primary Examiner* — Zandra Smith
*Assistant Examiner* — Jeremy J Joy
(74) *Attorney, Agent, or Firm* — Lee & Morse, P.C.

(57) ABSTRACT

A single electron transistor includes source/drain layers disposed apart on a substrate, at least one nanowire channel connecting the source/drain layers, a plurality of oxide channel areas in the nanowire channel, the oxide channel areas insulating at least one portion of the nanowire channel, a quantum dot in the portion of the nanowire channel insulated by the plurality of oxide channel areas, and a gate electrode surrounding the quantum dot.

20 Claims, 20 Drawing Sheets

SINGLE ELECTRON TRANSISTOR AND METHOD OF MANUFACTURING THE SAME

BACKGROUND OF THE INVENTION

1. Field of the Invention

Example embodiments relate to a semiconductor device and a method of manufacturing the same and, more particularly, to a single electron transistor and a method of manufacturing the same.

2. Description of the Related Art

In order to increase a degree of integration of a semiconductor device, the size of unit cells should be reduced. However, various technical difficulties may arise in attempting such a reduction. Further, even when the sizes are reduced, unexpected problems may be undesirably generated. For example, electrons in a channel region may be decreased in number to several tens of electrons, and a ratio of the number of electrons corresponding to statistical errors to the number of total electrons operating in the unit cells may be increased, thereby affecting a reliability of the operations of the unit cells. Thus, there is a demand for unit cells having a structure suitable for a high degree of integration.

One approach to achieving a high degree of integration is to employ a single electron transistor (SET), in which each electron may be controlled. In a SET, movements of a single electron may be controlled by adjusting a voltage applied to the transistor and the movements of the single electron may serve as a switch. For example, when a semiconductor particle having a size of about several nanometers to about several tens of nanometers, i.e., a quantum dot, is placed in a region between a source region and a drain region, a single electron may enter and leave the quantum dot by a single electron charging effect, such that an on-state and an off-state may be generated, which serves as a switch. When the SET is compared to a conventional metal-oxide-semiconductor field effect transistor (MOSFET), the number of electrons required for performing the same action in the SET may be much smaller than that required for the MOSFET, and thus power consumption may be decreased using the SET. Additionally, a reliability of the SET may be improved because each of the electrons may be controllable.

However, quantum dots are difficult to form uniformly with conventional techniques, and thus the SET has not been made easily manufacturable. In particular, forming a quantum dot having a size of about 10 nm or less presents difficulties using known photolithographic approaches. Moreover, the formation of quantum dots having a desired size using an e-beam direct writing method may be difficult because of the proximity effect.

Thus, there is a need for a method of reproducibly forming a quantum dot having a controlled size, e.g., several nanometers, in a SET. Further, there is a need for a method of forming a quantum dot in a desired location in the SET. Preferably, such a method would provide a quantum dot having a size of several nanometers in a gate-all-around (GAA)-type transistor, wherein a channel region is surrounded by a gate electrode in order to decrease short channel effects.

SUMMARY OF THE INVENTION

Embodiments are therefore directed to a single electron transistor and a method of manufacturing the same, which substantially overcome one or more of the problems due to the limitations and disadvantages of the related art.

It is therefore a feature of an embodiment to provide a single electron transistor having one or more quantum dots of a predetermined dimension, and a method of making the same.

It is therefore another feature of an embodiment to provide a single electron transistor having one or more quantum dots in predetermined locations, and a method of making the same.

At least one of the above and other features and advantages may be realized by providing a single electron transistor, including source/drain layers disposed apart on a substrate, at least one nanowire channel connecting the source/drain layers, a plurality of oxide channel areas in the nanowire channel, the oxide channel areas insulating at least one portion of the nanowire channel, a quantum dot in the portion of the nanowire channel insulated by the plurality of oxide channel areas, and a gate electrode surrounding the quantum dot.

The nanowire channel may include a first oxide channel area and a second oxide channel area, the first oxide channel area may be surrounded by the gate electrode, and the second oxide channel area may be disposed adjacent to a surface of the gate electrode.

The single electron transistor may further include an oxide layer at the surface of the gate electrode. The second oxide channel area may be connected to the oxide layer.

The nanowire channel may include another second oxide channel area, the other second oxide channel area may be disposed adjacent to a second surface of the gate electrode, the quantum dot may be between the first oxide channel area and the second oxide channel area, and a second quantum dot may be between the first oxide channel area and the other second oxide channel area.

The nanowire channel may have an extending portion that extends between a source/drain region and the second oxide channel area, and the extending portion may be surrounded by an oxide layer.

The nanowire channel may include two oxide channel areas, each oxide channel area may be disposed adjacent to one of two opposing surfaces of the gate electrode, and the quantum dot may be between the two oxide channel areas.

The quantum dot may have a thickness of about 2 to about 5 nanometers.

The quantum dot may be a section of the nanowire channel, and the quantum dot and the nanowire channel may have a same thickness.

At least two nanowire channels may connect the source/drain layers, each nanowire channel may have an oxide channel area disposed adjacent to a same side of the gate electrode, and each nanowire channel may be surrounded by a channel oxide layer, the channel oxide layer being surrounded by the gate electrode.

The single electron transistor may further include an oxide layer at the same side of the gate electrode. The oxide layer may be connected to each of the oxide channel areas adjacent to the same side of the gate electrode.

At least one of the above and other features and advantages may also be realized by providing a method of manufacturing a single electron transistor, including forming source/drain layers disposed apart on a substrate, at least one nanowire channel connecting the source/drain layers, forming a plurality of oxide channel areas in the nanowire channel, the oxide channel areas insulating at least one portion of the nanowire channel and a quantum dot being in the portion of the nanowire channel insulated by the plurality of oxide channel areas, and forming a gate electrode that surrounds the quantum dot.

Forming the plurality of oxide channel areas may include oxidizing a portion of the nanowire channel adjacent to a surface of the gate electrode.

The method may further include forming an oxide layer at the surface of the gate electrode, the oxide layer being connected to the oxidized portion of the nanowire channel.

Forming the plurality of oxide channel areas in the nanowire channel may include forming a first oxide channel area in the nanowire channel such that the first oxide channel area is surrounded by the gate electrode, and forming a second oxide channel area in the nanowire channel adjacent to a surface of the gate electrode.

Forming the first oxide channel area may include, prior to forming the gate electrode, forming a first sacrificial material on the nanowire channel, partially etching the first sacrificial layer to thin a portion of the first sacrificial material, oxidizing a portion of the nanowire channel that corresponds to the thinned portion of the first sacrificial material, and removing the first sacrificial material from the nanowire channel after the oxidation.

The method may further include, after removing the first sacrificial material, oxidizing a surface of the nanowire channel to form an oxide layer thereon, such that, after forming the gate electrode, the oxidized surface of the nanowire channel is between the nanowire channel and the gate electrode.

Forming the second oxide channel area may include forming an oxide layer at a surface of the gate electrode, and oxidizing a portion of the nanowire channel. The oxidized portion of the nanowire channel may be connected to the oxide layer.

Forming the nanowire channel may include forming a sacrificial layer on the substrate, forming a channel layer on the sacrificial layer, partially removing the channel layer and the sacrificial layer to form the nanowire channel, the source/drain layers, a first sacrificial layer pattern beneath the nanowire channel, and a pair of second sacrificial layer patterns beneath the source/drain layers. The second sacrificial layer patterns may be disposed apart from each other and may be connected by the first sacrificial layer pattern, and the source/drain layers may be connected by the nanowire channel. Forming the nanowire channel may further include removing the first sacrificial layer pattern from beneath the nanowire channel.

The channel layer may be single crystalline silicon, and the sacrificial layer may include silicon germanium.

The nanowire channel may be surrounded by a channel oxide layer, and forming the gate electrode may include surrounding the nanowire channel between the source/drain layers with a gate conductive layer, and partially removing the gate conductive layer to form the gate electrode, the gate electrode being disposed apart from the source/drain layers, and the channel oxide layer being between the nanowire channel and the gate electrode.

BRIEF DESCRIPTION OF THE DRAWINGS

The above and other features and advantages will become more apparent to those of ordinary skill in the art by describing in detail example embodiments with reference to the attached drawings, in which.

DETAILED DESCRIPTION OF THE INVENTION

Figure 1A:
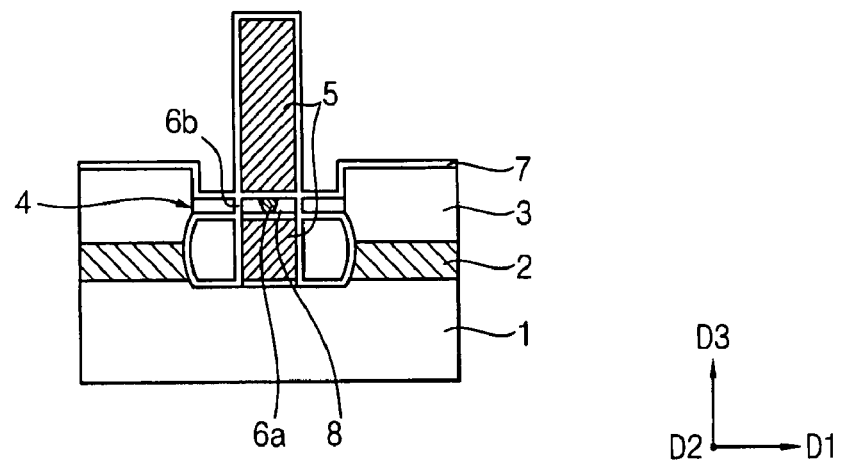
FIG. 1A illustrates a cross-sectional view of a single electron transistor in accordance with an example embodiment.

Korean Patent Application No. 2006-97507, filed on Oct. 4, 2006, in the Korean Intellectual Property Office, and entitled: "Single Electron Transistor and Method of Manufacturing the Same," is incorporated by reference herein in its entirety.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art. In the figures, the dimensions of layers and regions may be exaggerated for clarity of illustration. Like reference numerals refer to like elements throughout.

Figure 1B:
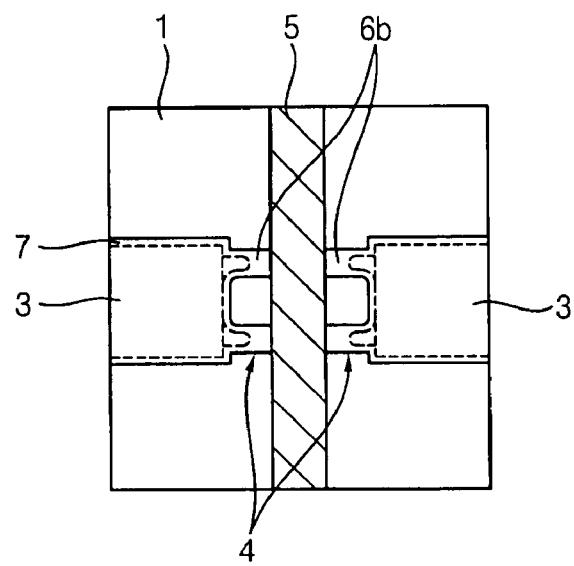
FIG. 1B illustrates a top view of the single electron transistor shown in FIG. 1A.

FIG. 1A illustrates a cross-sectional view of a single electron transistor in accordance with an example embodiment, and FIG. 1B illustrates a top view of the single electron transistor shown in FIG. 1A.

Referring to FIGS. 1A and 1B, the single electron transistor may include a sacrificial layer pattern 2, source/drain layers 3, and a gate electrode 5 on a substrate 1. The substrate 1 may be, e.g., a semiconductor substrate. The substrate 1 may include silicon. In an implementation, the substrate 1 may include single crystalline silicon. The single electron transistor may also include a nanowire channel 4 between each of the source/drain layers 3, and an oxide layer 7. The nanowire channel 4 may include a first oxide channel region 6a, a second oxide channel region 6b and a quantum dot 8.

An upper portion of the substrate 1 may protrude in a third direction D3 substantially perpendicular to a plane of the major portion substrate 1, and a sacrificial layer pattern 2 may be formed on the protruding upper portion of the substrate 1.

The sacrificial layer pattern 2 may include a material having an etching selectivity with respect to the substrate 1 and the source/drain layers 3. In an implementation, the sacrificial layer pattern 2 may include silicon germanium. The sacrificial layer pattern 2 may be patterned from a sacrificial layer that is used in a process for forming the nanowire channel 4, as described below. In another implementation (not shown), forming the nanowire channel may be performed without the sacrificial layer pattern 2.

The source/drain layers 3 may be formed on the sacrificial layer pattern 2. In implementation, the source/drain layers 3 may include impurity-doped single crystalline silicon.

The nanowire channel 4 may connect the source/drain layers 3 to each other. The source/drain layers 3 may be separated in a first direction, e.g., in the direction D1 in FIG. 1A, and the nanowire channel may form a bridge therebetween. The nanowire channel 4 may be generally cylindrical, and may have a circular cross-section, an elliptical cross-section, etc. The nanowire channel 4 may extend in a lengthwise direction in parallel with the first direction D1. In an implementation, the nanowire channel 4 may include single crystalline silicon.

Referring to FIG. 1B, in an example embodiment, two or more nanowire channels 4 may be disposed between the source/drain layers 3. Each of the nanowire channels 4 may have the first oxide channel region 6a, i.e., an oxide region, at a central portion thereof, so that portions of each nanowire channel 4 may be insulated from each other. In another implementation (not shown), a plurality of the first oxide channel regions 6a may be formed in each nanowire channel 4.

One or more second oxide channel regions 6b, i.e., oxide regions, may be formed at portions of the nanowire channel 4 adjacent to a surface of the gate electrode 5, so that portions of each nanowire channel 4 may be insulated from one another.

Referring to FIG. 1A, in an example embodiment, two quantum dots 8 may be formed in each of the nanowire channels 4, the quantum dots 8 being insulated from each other by the first oxide channel region 6a and defined by the first and second oxide channel regions 6a and 6b. In an implementation, the quantum dots 8 may have a thickness, e.g., a diameter, of about 2 nm to about 5 nm.

The gate electrode 5 may extend in a second direction D2 substantially perpendicular to the first direction D1 and may have a predetermined height. The gate electrode 5 may enclose the portion of the nanowire channel 4 in which the quantum dots 8 are located. The gate electrode 5 may include, e.g., a metal nitride such as titanium nitride, tantalum nitride, etc., or a metal such as titanium, tantalum, etc.

The oxide layer 7 may be formed on the substrate 1, the sacrificial layer pattern 2, the source/drain layers 3, the nanowire channel 4 and/or the gate electrode 5.

The single electron transistor (SET) may be a gate-all-around (GAA) type semiconductor device in which the gate electrode 5 encloses the nanowire channel 4. A single electron in the SET may enter and leave the quantum dot 8 so that an on-state and an off-state may be generated. According to an embodiment, the quantum dot 8 may be formed to a predetermined size, e.g., several nanometers, using an oxidation process to form the first and second oxide channel regions 6a and 6b in the nanowire channel 4. Thus, a semiconductor device including the SET may operate at a relatively low power consumption.

Figure 2:
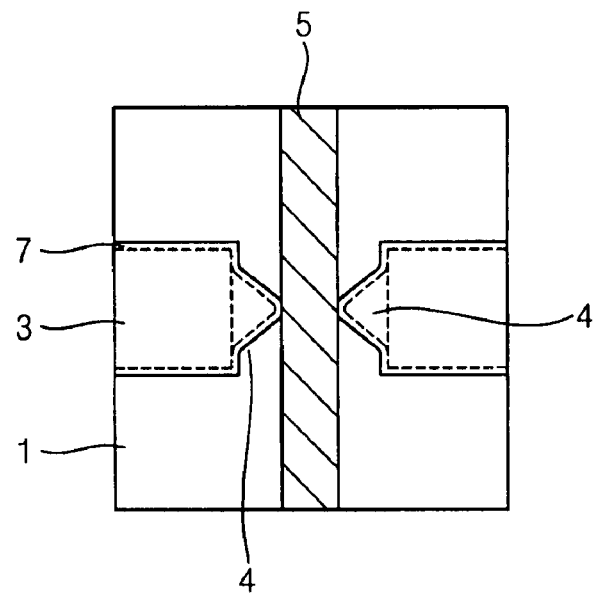
FIG. 2 illustrates a top view of a single electron transistor in accordance with another example embodiment.

FIG. 2 illustrates a top view of a SET in accordance with another example embodiment.

Referring to FIG. 2, the SET may have the substrate 1, the source/drain regions 3, the nanowire channel 4, the gate electrode 5 and the oxide layer 7. In this example embodiment, the SET may have one nanowire channel 4. As shown in FIG. 1A, two quantum dots 8 may be formed in the nanowire channel 4 enclosed by the gate electrode 5, and each quantum dot may contain one electron.

Figure 3:
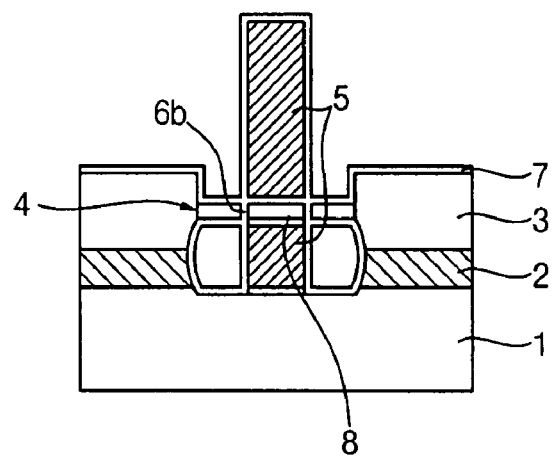
FIG. 3 illustrates a cross-sectional view of a single electron transistor in accordance with another example embodiment.

FIG. 3 illustrates a cross-sectional view of a SET in accordance with another example embodiment.

Referring to FIG. 3, the SET may have the substrate 1, the sacrificial layer pattern 2, the source/drain regions 3, the nanowire channel 4, the gate electrode 5 and the oxide layer 7. The SET may not include the first oxide channel region 6a (see FIG. 1A), such that the nanowire channel 4 may have one quantum dot 8 that may contain one electron. The semiconductor device may have one, two, or more nanowire channels 4.

As described above, the SET in accordance with example embodiments may be a GAA type semiconductor device, and may have one or more quantum dots according to the number of the nanowire channels and/or the number of the oxide channel regions. In an implementation, the semiconductor device may serve as a quantum-dot cellular automata (QCA) when a plurality of the quantum dots is arranged to form a quantum dot array.

Figure 4A:
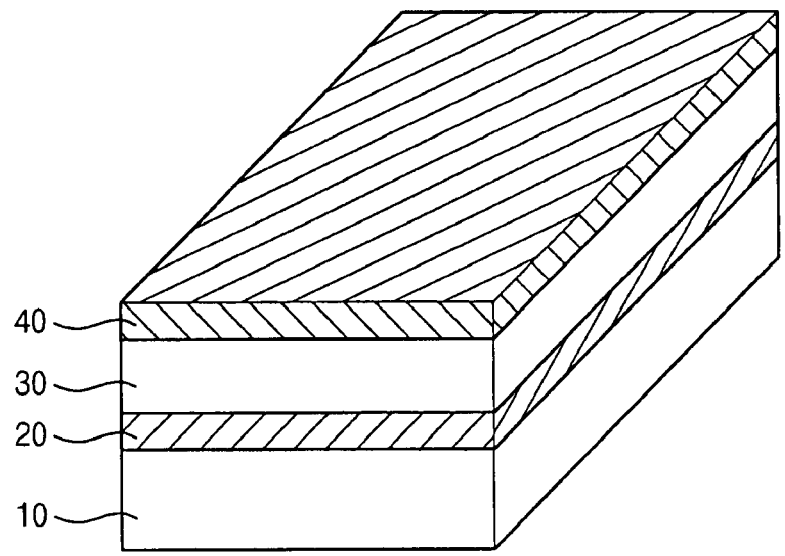
FIGS. 4A-4T illustrate perspective views of stages in a method of manufacturing a single electron transistor in accordance with an example embodiment.
Figure 4B:
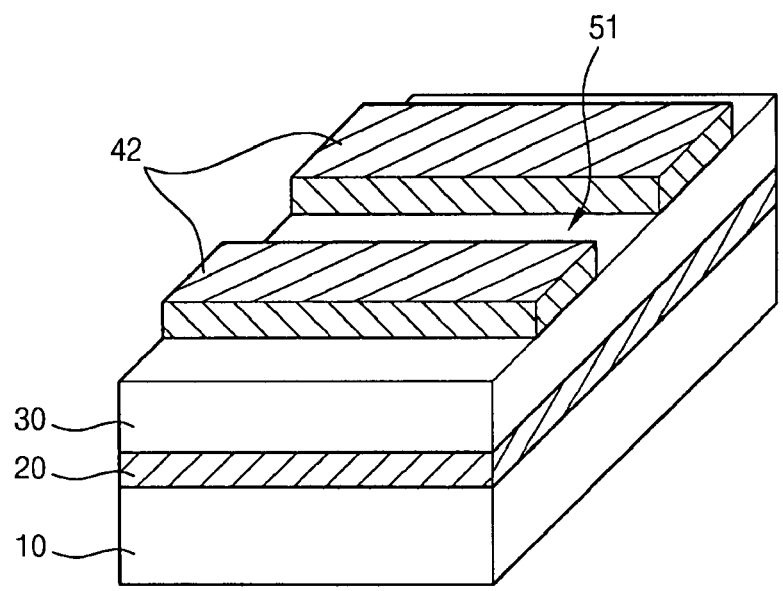
FIGS. 4KS-4NS, 4OS-1, 4OS-2, 4PS-4RS, 4SS-1, 4SS-2 and 4TS illustrate selective cross-sectional views of the method shown in FIGS. 4A-4T.
FIGS. 4RT, 4ST-1, 4ST-2 and 4TT illustrate selective top views of the method shown in FIGS. 4A-4T.
Figure 4C:
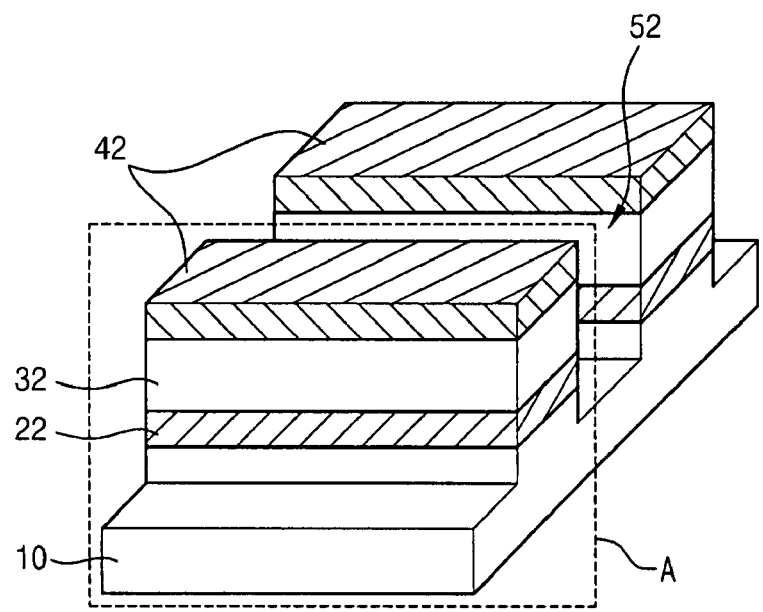
Figure 4D:
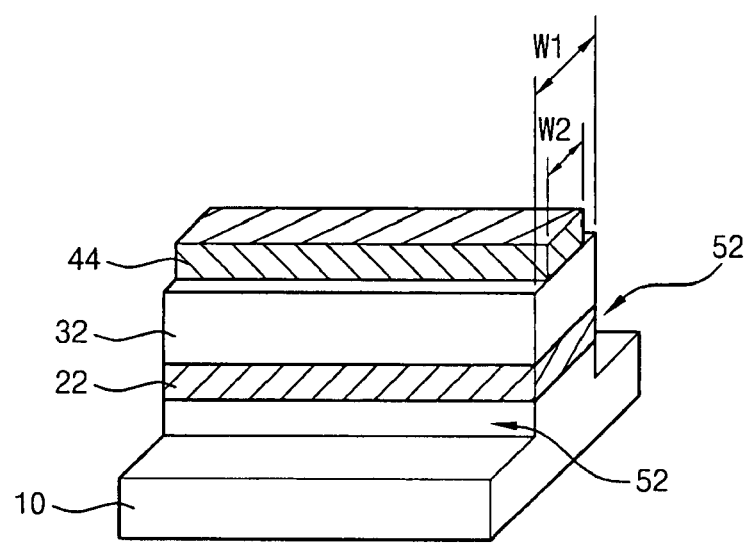
Figure 4E:
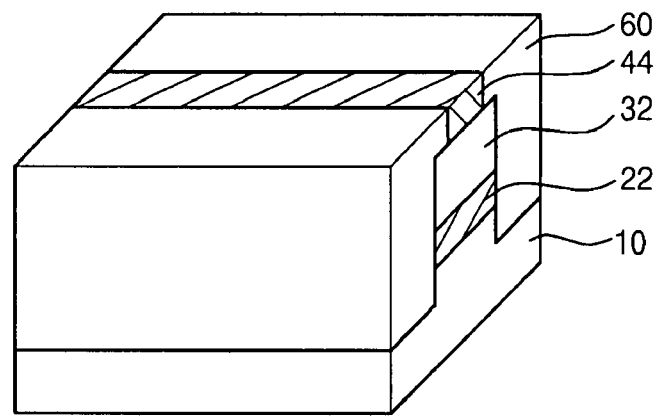
Figure 4F:
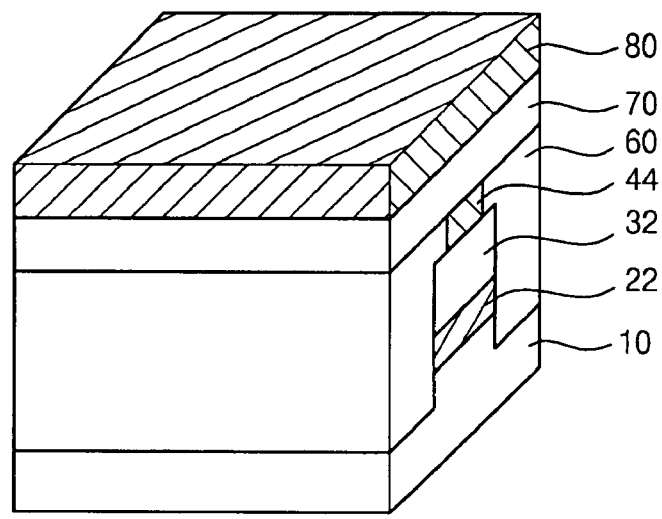
Figure 4G:
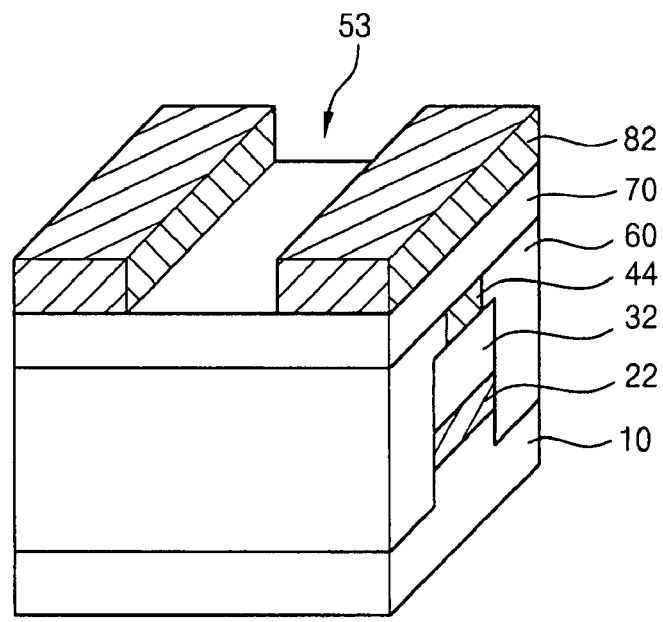
Figure 4H:
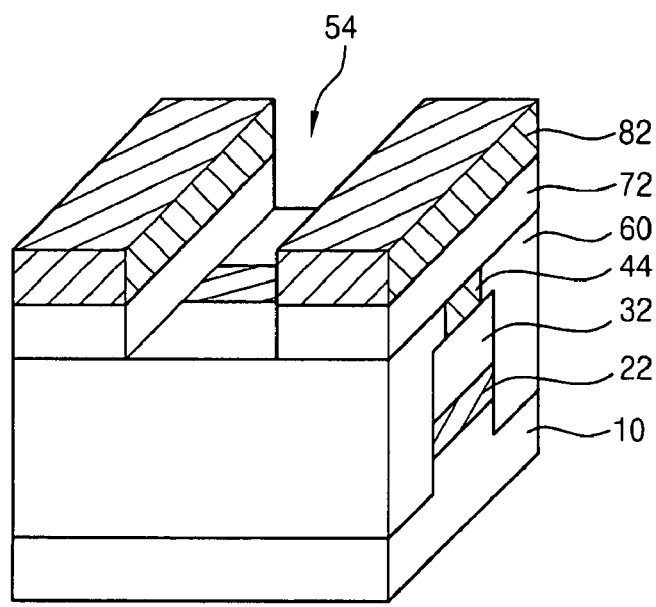
Figure 4I:
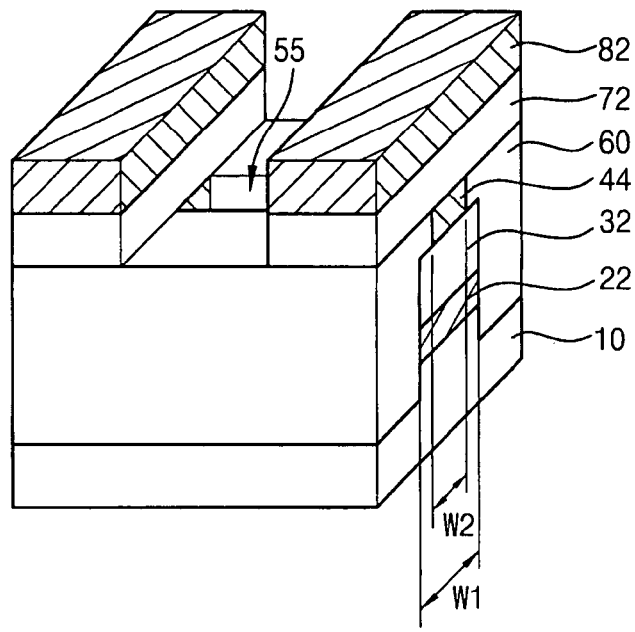
Figure 4J:
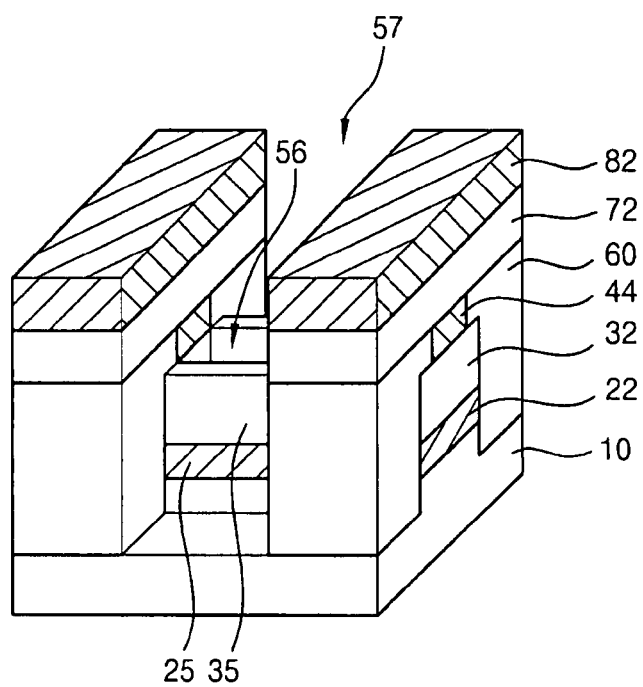
Figure 4K:
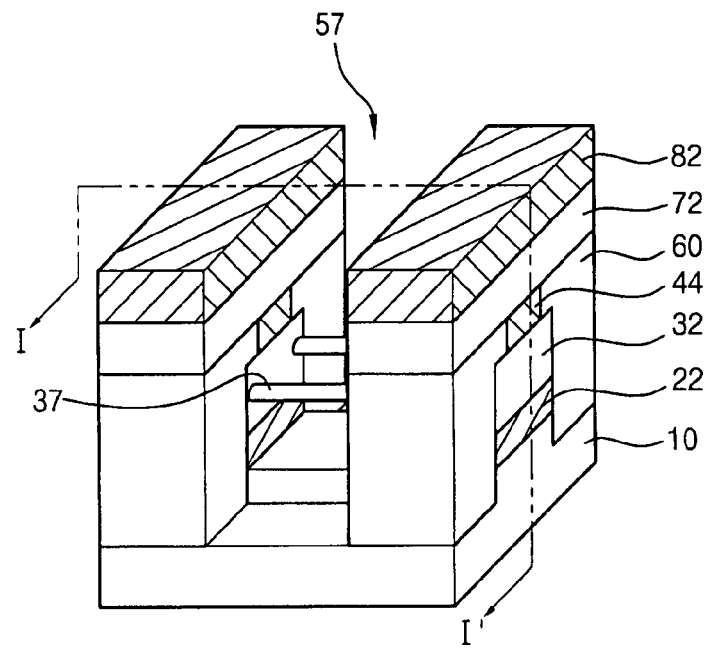
Figure 4K:
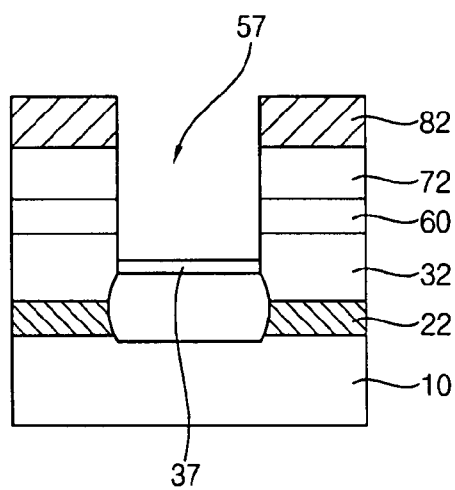
Figure 4L:
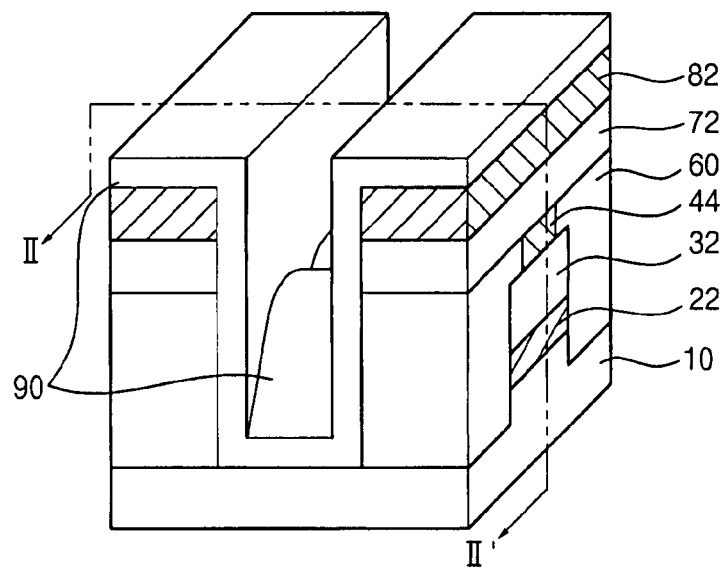
Figure 4L:
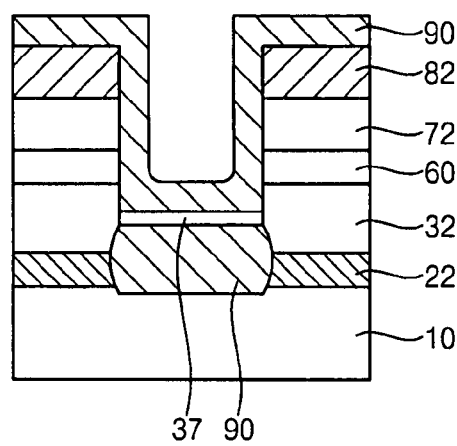
Figure 4M:
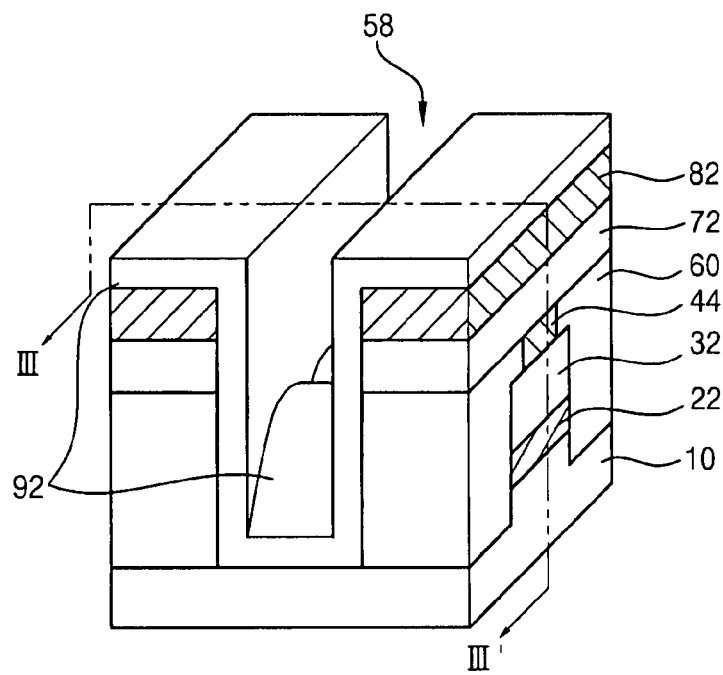
Figure 4M:
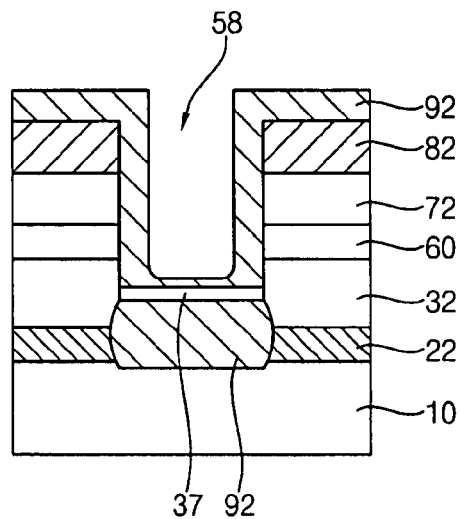
Figure 4N:
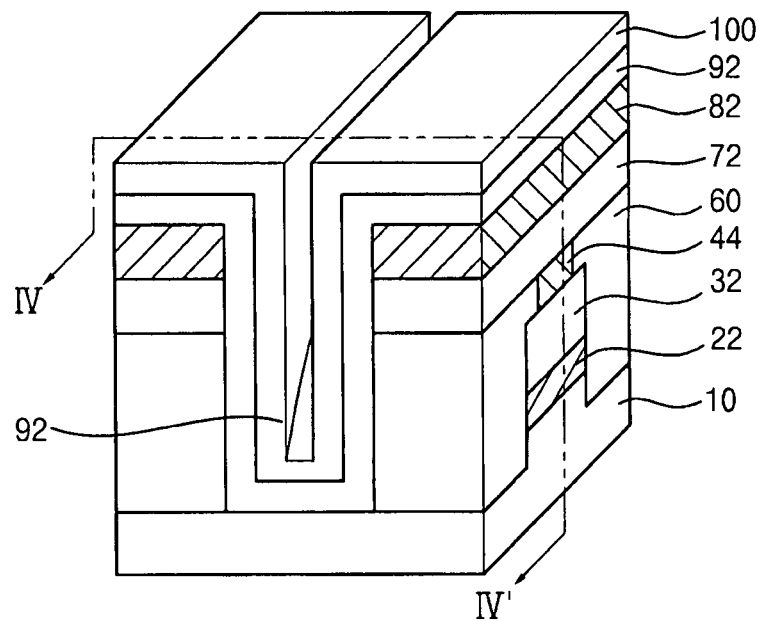
Figure 4N:
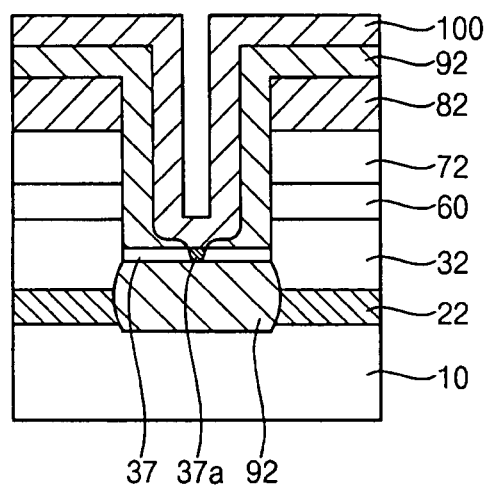
Figure 40:
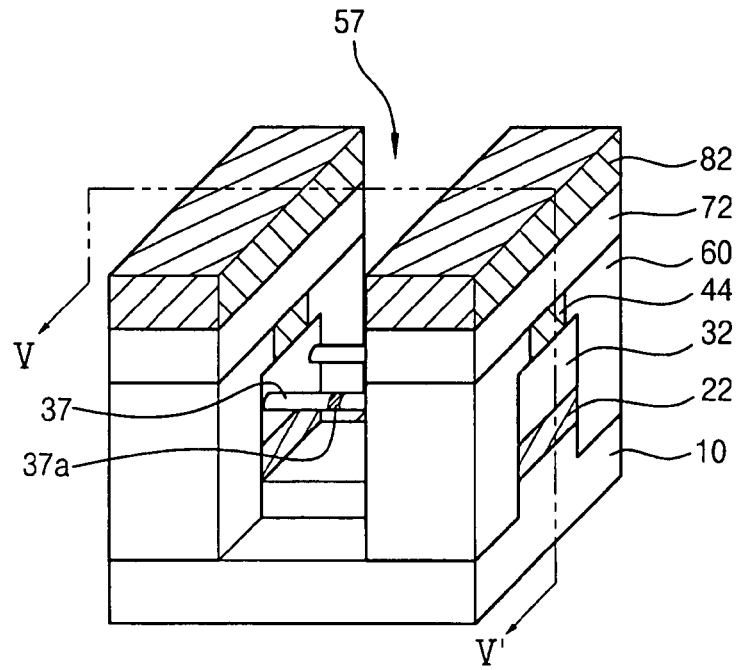
Figures 1, 40S:
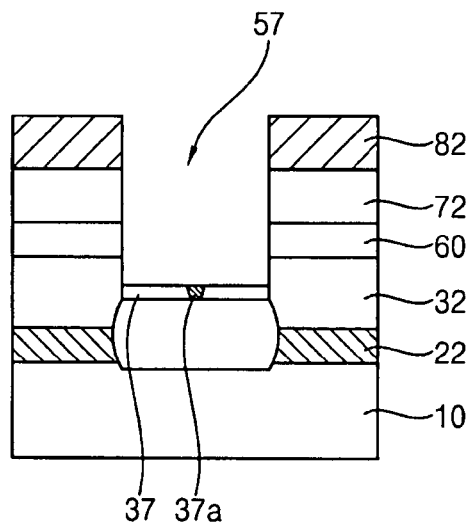
Figure 4O:
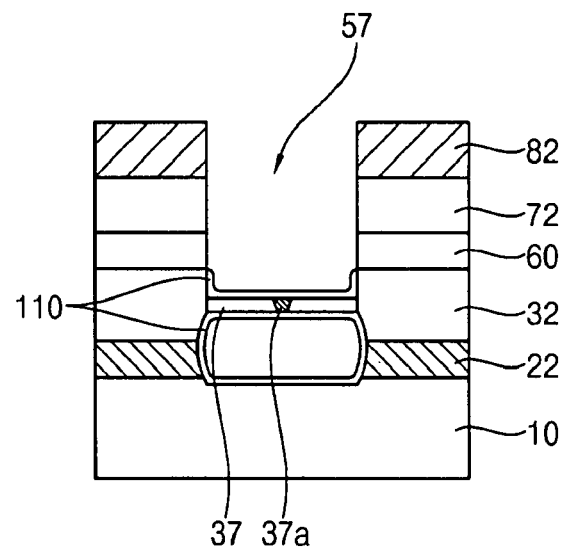
Figure 4P:
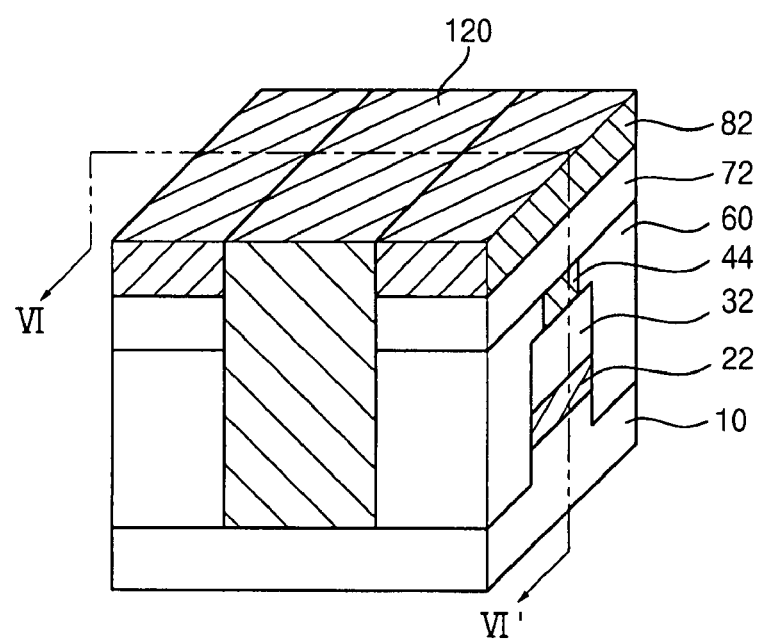
Figure 4P:
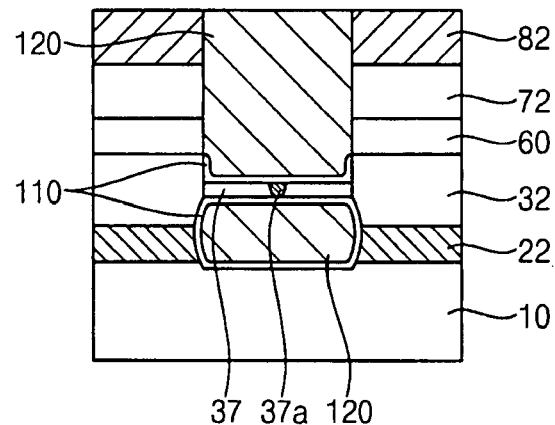
Figure 4Q:
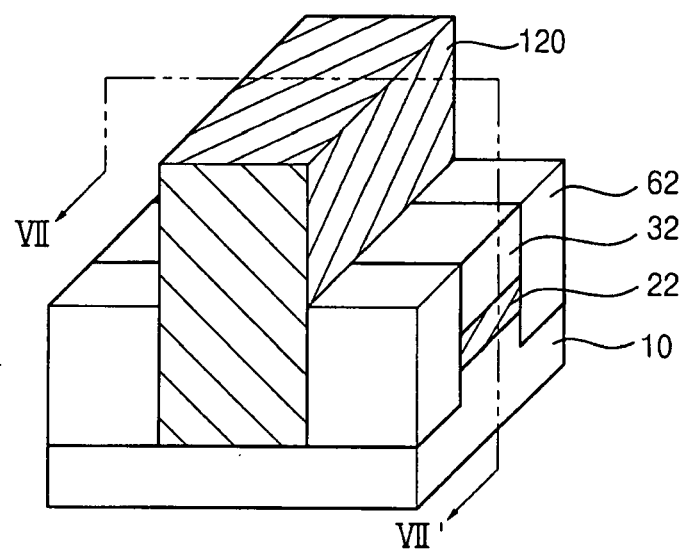
Figure 4Q:
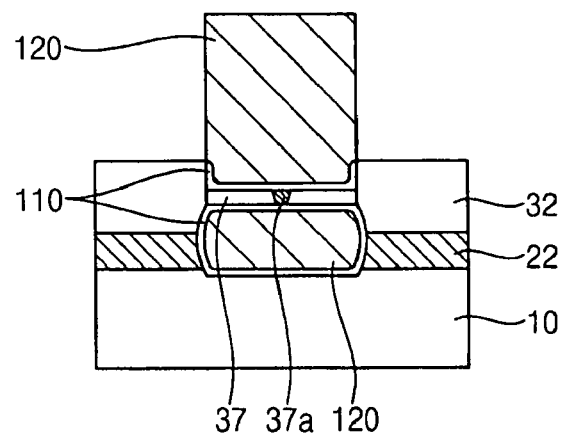
Figure 4R:
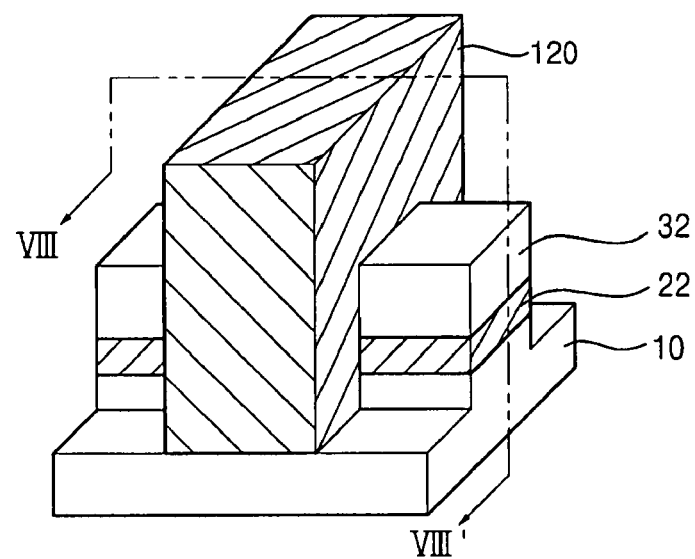
Figure 4R:
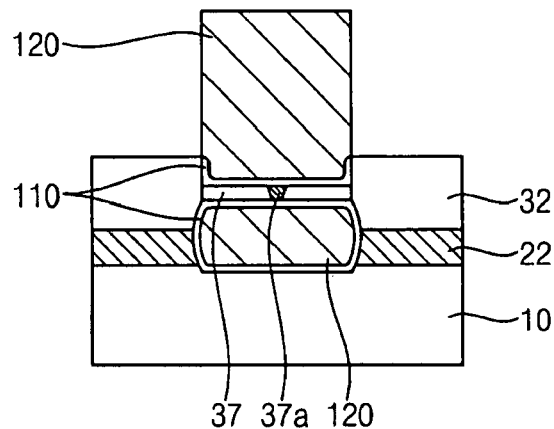
Figure 4R:
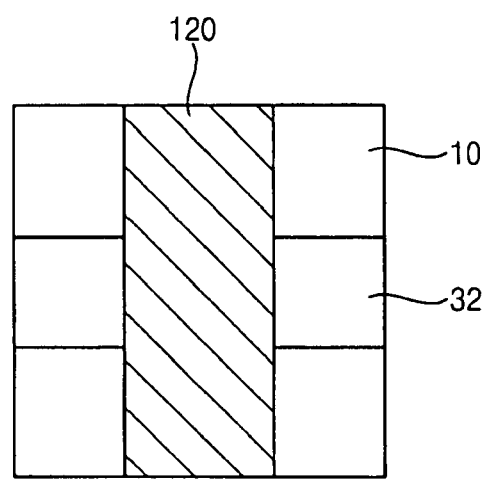
Figure 4S:
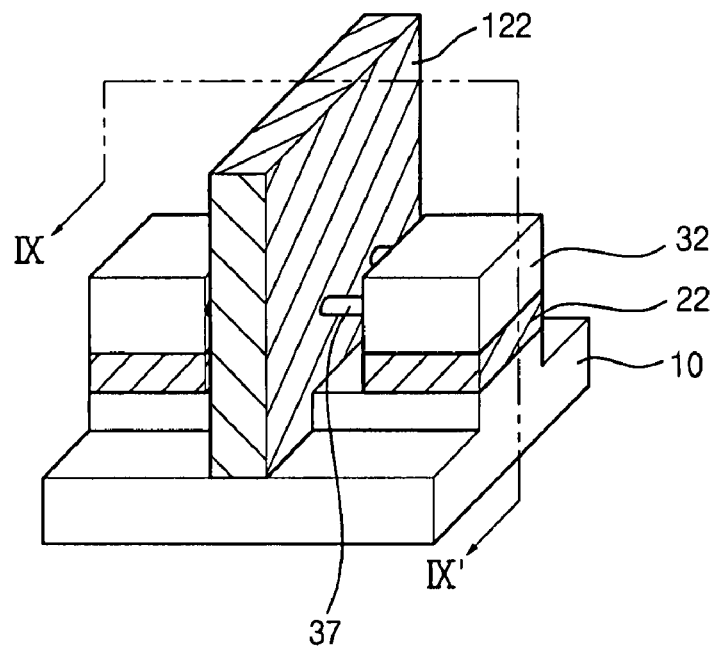
Figure 4S:
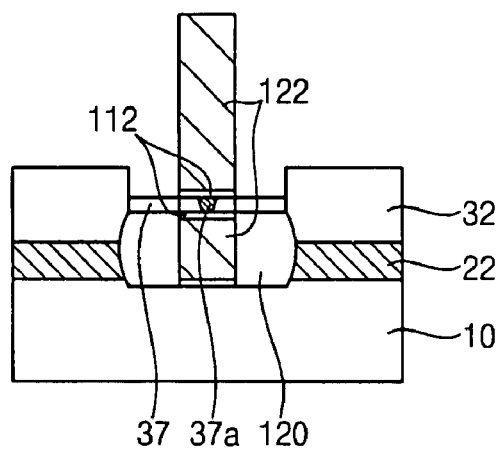
Figure 4S:
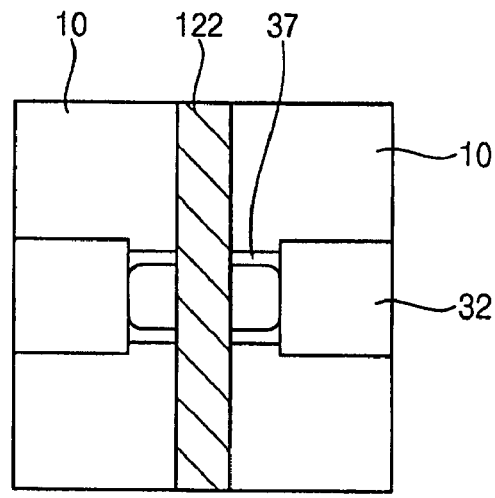
Figure 4S:
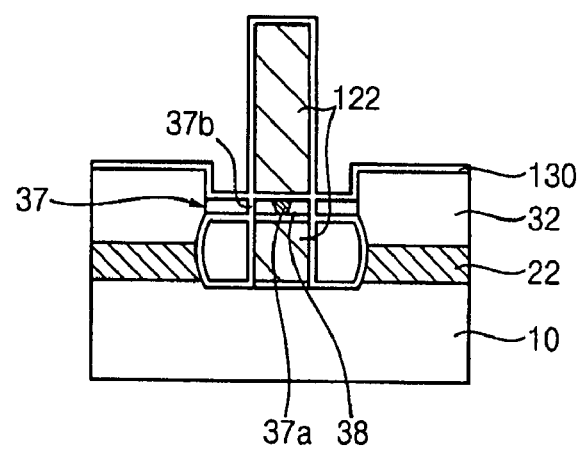
Figure 4S:
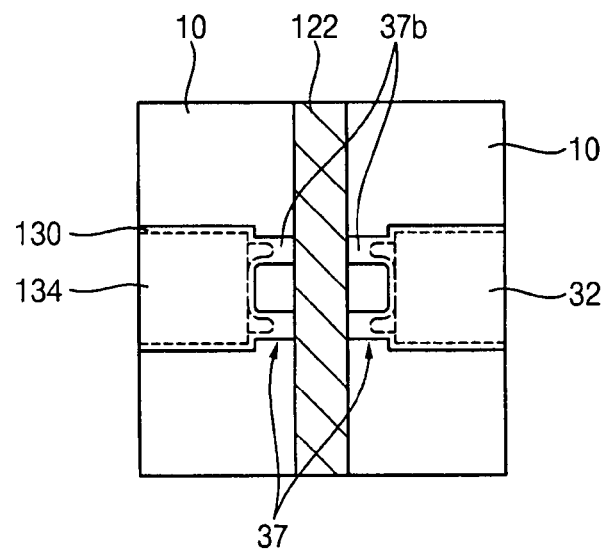
Figure 4T:
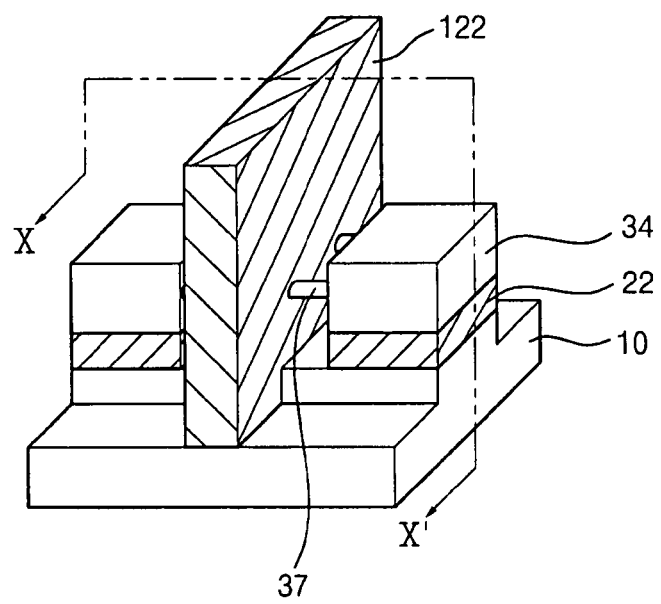
Figure 4T:
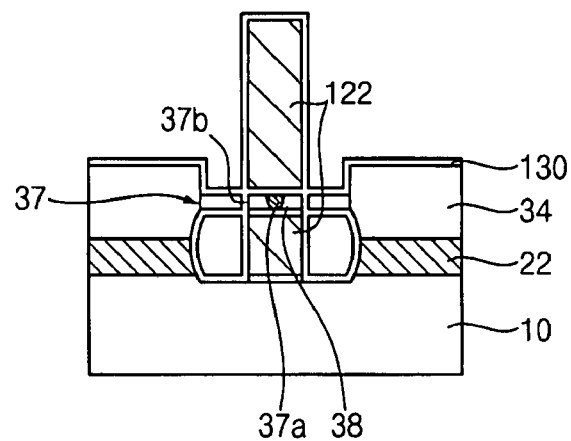
Figure 4T:
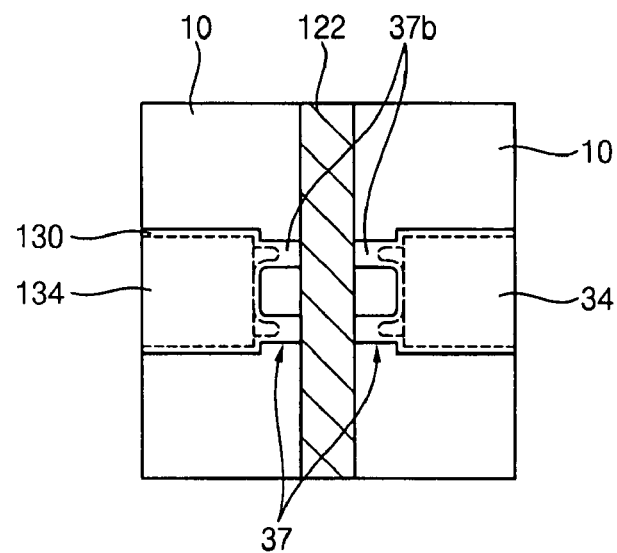

FIGS. 4A-4T illustrate perspective views of stages in a method of manufacturing a single electron transistor in accordance with an example embodiment. Additionally, selective cross-sectional views, identified by a suffix "S," and selective top views, identified by a suffix "T," illustrate additional views of the method illustrated in FIGS. 4A-4T.

Referring to FIG. 4A, a first sacrificial layer 20, a channel layer 30 and a first mask layer 40 may be formed on a substrate 10, e.g., a semiconductor substrate.

The semiconductor substrate 10 and the channel layer 30 may be formed using, e.g., silicon. In an implementation, the semiconductor substrate 10 and the channel layer 30 may be formed using single crystal silicon.

The sacrificial layer 20 may be partially removed in a subsequent process, described below, and thus may be formed using a material having an etching selectivity with respect to the channel layer 30. In an implementation, the sacrificial layer 20 may be formed using silicon germanium, e.g., using an epitaxial growth process. The channel layer 30 may be also formed by an epitaxial growth process.

The first mask layer 40 may be formed using a material having an etching selectivity with respect to the channel layer 30, the sacrificial layer 20 and the semiconductor substrate 10, so as to be used as an etching mask in a subsequent process. For example, the first mask layer 40 may be formed using a nitride such as silicon nitride. In an implementation (not shown), a pad oxide layer may be further formed between the channel layer 30 and the first mask layer 40.

Referring to FIG. 4B, the first mask layer 40 may be patterned to extend in the first direction D1. Thus, a plurality of first masks 42 having a first opening 51 therebetween may be formed to partially expose the channel layer 30. The first masks 42 may be formed by a general photolithography process using a first photoresist layer (not shown). The plurality of the first masks 42 may be disposed in a second direction D2 substantially perpendicular to the first direction D1.

Referring to FIG. 4C, the channel layer 30, the sacrificial layer 20 and the semiconductor substrate 10 may be partially removed, e.g., using an etching process using the first masks 42 as etching masks, so that a second opening 52 partially exposing an upper face of the semiconductor substrate 10 is formed. In another implementation (not shown), the portion of the semiconductor substrate 10 may not be removed by the etching.

The etching may form a preliminary sacrificial layer pattern 22 and a preliminary channel layer pattern 32 on the semiconductor substrate 10. The etching process may include, e.g., a dry etching process using an etching gas or a wet etching process using an etching solution. When the semiconductor substrate 10, the sacrificial layer 20 and the channel layer 30 are formed using silicon, silicon germanium and silicon, respectively, examples of the etching solution may include a mixed solution containing hydrogen peroxide, hydrogen fluoride and acetic acid, a mixed solution containing ammonium hydroxide, hydrogen peroxide and deionized water, a solution containing peracetic acid, etc.

When a plurality of the first masks 42 is formed, a plurality of the second openings 52 may be disposed in the second direction D2. Hereinafter, a sub-area A disposed between two of the second openings 52 will be described for simplicity.

Referring to FIG. 4D, the first mask 42 may be trimmed to form a mask pattern 44 so that an upper face of the preliminary channel layer pattern 32 may be partially exposed. For example, a portion of the first mask 42 that extends in the first direction D1 may be removed so that the upper face of the preliminary channel layer pattern 32 may be partially exposed. When the first mask 42 is formed using a nitride such as silicon nitride, the first mask 42 may be trimmed by a wet etching process, e.g., using phosphoric acid.

The preliminary channel layer pattern 32 may have a first width W1 and the mask pattern 44 may have a second width W2 smaller than the first width W1. A difference between the first and second widths W1 and W2 may be proportional to a diameter of a nanowire channel that is subsequently formed, as described in detail below. Thus, when the mask pattern 44 is formed, the first mask 42 may be trimmed in consideration of the diameter of the nanowire channel. Accordingly, the diameter of the nanowire channel may be precisely determined.

Referring to FIG. 4E, a first insulation layer 60 may be formed on the semiconductor substrate 10 to cover the mask pattern 44, the preliminary channel layer pattern 32 and the preliminary sacrificial layer pattern 22. The first insulation layer 60 may be formed using, e.g., an oxide such as silicon oxide. The first insulation layer 60 may be partially removed until a top surface of the mask pattern 44 is exposed. The top surface of the first insulation layer 60 and a top surface of the mask pattern 44 may be partially removed by, e.g., planarizing with a chemical mechanical polishing (CMP) process, an etch-back process, a combination process of CMP and etch-back, etc.

Referring to FIG. 4F, a second insulation layer 70 and a second mask layer 80 may be formed on the first insulation layer 60 and the mask pattern 44. The second insulation layer 70 may be formed using a material substantially the same as that of the first insulation layer 60, or a material different therefrom. The second insulation layer 70 may be formed using a material having an etching selectivity with respect to the second mask layer 80, the mask pattern 44, the preliminary channel layer pattern 32 and the preliminary sacrificial layer pattern 22. In an implementation, the second insulation layer 70 may be formed using an oxide.

The second mask layer 80 may be formed using a material substantially the same as that of the first mask layer 40, or a material different therefrom. The second mask layer 80 may be formed using a material having an etching selectivity with respect to the second insulation layer 70, the mask pattern 44, the preliminary channel layer pattern 32 and the preliminary sacrificial layer pattern 22. In an implementation, the second mask layer 80 may be formed using a nitride.

Referring to FIG. 4G, the second mask layer 80 may be patterned to extend in the second direction D2. Thus, a second mask 82 having a third opening 53 therethrough, which partially exposes the second insulation layer 70, may be formed. The second mask 82 may be formed by a general photolithography process using a second photoresist layer (not shown).

Referring to FIG. 4H, a portion of the second insulation layer 70 exposed by the third opening 53 may be removed, e.g., using an etching process using the second mask 82 as an etching mask, to form a fourth opening 54 partially exposing the mask pattern 44 and the first insulation layer 60. Thus, a second insulation layer pattern 72 may be formed on the mask pattern 44 and the first insulation layer 60. The etching process may include, e.g., a dry etching process using an etching gas or a wet etching process using an etching solution. When the second insulation layer 70 is formed using an oxide such as silicon oxide, the etching solution may include a mixed solution containing nitric acid and hydrofluoric acid.

Referring to FIG. 4I, a portion of the mask pattern 44 exposed by the fourth opening 54 may be removed, e.g., using an etching process using the second mask 82, the second insulation layer pattern 72 and a portion of the first insulation layer 60 that is exposed using the fourth opening 54 as etching masks, so as to form a fifth opening 55 partially exposing the preliminary channel layer pattern 32. The etching process may include a dry etching process using an etching gas. A portion of the preliminary channel layer pattern 32 exposed by the fifth opening 55 and a portion of the preliminary sacrificial layer pattern 22 disposed beneath the exposed portion of the preliminary channel layer pattern 32 may be removed by the dry etching process.

As described above, the first width W1 of the preliminary channel layer pattern 32 may be greater than the second width W2 of the mask pattern 44, and portions of the preliminary channel layer pattern 32 and the preliminary sacrificial layer pattern 22, which correspond to the second width W2, may be removed. However, other portions of the preliminary channel layer pattern 32 and the preliminary sacrificial layer pattern 22 may remain intact. Thus, a sixth opening 56 (see FIG. 4J) exposing a portion of the semiconductor substrate 10 may be formed, and a first sacrificial layer pattern 25 and a channel layer pattern 35 may be formed on another portion of the semiconductor substrate 10 that is not exposed by the sixth opening 56.

Portions of the mask pattern 44, the preliminary channel layer pattern 32 and the preliminary sacrificial layer pattern 22 that are disposed beneath the second mask 82 and the second insulation layer pattern 72 may not be exposed by the fifth opening 55 and may not be removed in the dry etching process. Thus, these portions may remain on the semiconductor substrate 10.

Referring to FIG. 4J, a portion of the first insulation layer 60 exposed by the fourth opening 54 may be removed to form a seventh opening 57 having the channel layer pattern 35 and the first sacrificial layer pattern 25 therein. The seventh opening 57 may be formed by, e.g., a dry etching process using an etching gas or by a wet etching process using an etching solution. When the first insulation layer 60 is formed using an oxide such as silicon oxide, the etching solution may include a mixed solution containing nitric acid and hydrofluoric acid.

Referring to FIGS. 4K and 4KS, the first sacrificial layer pattern 25 may be removed by an etching process so that the channel layer pattern 35 may be transformed to a nanowire channel 37. The first sacrificial layer pattern 25 may be removed by, e.g., a wet etching process using an etching solution or an isotropic plasma etching process using an etching gas. The etching solution may include a solution having an etching selectivity between those of silicon germanium and silicon, and between those of silicon germanium and oxide. The isotropic plasma etching process may be performed under an atmosphere having mixed gas including hydrogen bromide and oxygen.

When the first sacrificial layer pattern 25 is removed by the etching process, a portion of the channel layer pattern 35 and a portion of the semiconductor substrate 10 may also be etched, in which case a nanowire channel 37 having a size smaller than that of the channel layer pattern 35 may be formed.

The nanowire channel 37 may have a square pillar shape, or may have the circular cylinder or an elliptic cylindrical shape shown in FIG. 4K. When the nanowire channel 37 has the square pillar shape, an annealing process may be performed on the nanowire channel 37 under a hydrogen atmosphere so that an edge portion of the nanowire channel 37 may be rounded. The annealing process may be performed at a temperature of about 800° C. to about 1,000° C. under a pressure below about 10 Torr for about 100 seconds to about 1,000 seconds. When the edge portion of the nanowire channel 37 is rounded by the annealing process, an area at which a nanowire channel is surrounded by a gate electrode 122 (see FIG. 4S) may be increased, so that a short channel effect may be reduced and characteristics of a gate insulation layer (not shown) may be improved.

When the portion of the preliminary channel layer pattern 32 exposed by the fifth opening 55 is removed by a dry etching process to form the channel layer pattern 35, a relatively small amount of the portion may be etched at a region near the remaining preliminary channel layer pattern 32, so that the channel layer pattern 35 may have a rounded end portion. Thus, the nanowire channel 37 that is transformed from the channel layer pattern 35 may also have a rounded end portion (see FIG. 4ST-1).

Referring to FIGS. 4L and 4LS, a second sacrificial layer 90 may be formed on a bottom and a sidewall of the seventh opening 57, on the second mask 82, and covering the nanowire channel 37. The second sacrificial layer 90 may be formed using a material having an etching selectivity with respect to the second mask 82, the second insulation layer pattern 72, the first insulation layer 60, the mask pattern 44, the nanowire channel 37, the preliminary channel layer pattern 32, the preliminary sacrificial layer pattern 22 and the semiconductor substrate 10, in consideration of a subsequent etching process. In an implementation, the second sacrificial layer 90 may be formed using polysilicon by a chemical vapor deposition (CVD) process.

Referring to FIGS. 4M and 4MS, the second sacrificial layer 90 may be partially removed, e.g., using a dry etching process, to form a second sacrificial layer pattern 92. A portion of the second sacrificial layer 90 on the nanowire channel 37 may be etched so that a vertical thickness of the portion of the second sacrificial layer 90 on the nanowire channel 37 is decreased. A space defined by the second sacrificial layer pattern 92 may form an eighth opening 58.

Referring to FIGS. 4N and 4NS, an exposed top surface of the second sacrificial layer pattern 92 may be oxidized to form a first oxide layer 100. Additionally, a portion of the nanowire channel 37 adjacent to the eighth opening 58 may be oxidized to form a first oxide channel region 37a. For example, the top surface of the second sacrificial layer pattern 92 including polysilicon may be oxidized by a first oxidization process in which a heat treatment is performed under an oxygen atmosphere. In the first oxidization process, the portion of the nanowire channel 37 adjacent to the eighth opening 58 may also be oxidized to form the first oxide channel region 37a. Thus, the nanowire channel 37 may be divided into two portions insulated from each other, corresponding to the oxidation of the top surface of the second sacrificial layer pattern 92 contacting the nanowire channel 37.

Notably, the first oxide channel region 37a may be controllably formed as a result of the vertical thickness of the second sacrificial layer pattern 92, which is deposited on the nanowire channel 37, being decreased by the above-described dry etching process. Moreover, even when the nanowire channel 37 is not divided into the two portions insulated from each other after performing the first oxidization process, the nanowire channel 37 may nonetheless be divided into two portions insulated from each other by a second oxidization process.

A vertical thickness of the second sacrificial layer pattern 92 deposited on a predetermined portion of the nanowire channel 37 may be varied by controlling an etching degree for the corresponding portion of the second sacrificial layer 90. Thus, a location of the first oxide channel region 37a, which may be formed beneath the portion of the second sacrificial layer pattern 92 that has the reduced thickness as a result the first oxidization process, may be adjusted.

In another implementation (not shown), a plurality of quantum dots 8 insulated from one another by the first oxide channel regions 37a may be formed in the nanowire channel 37 by forming a plurality of the first oxide channel regions 37a in the nanowire channel 37.

Referring to FIGS. 4O and 4OS-1, the first oxide layer 100 and the second sacrificial layer pattern 92 may be removed by an etching process, and thus the seventh opening 57 having the nanowire channel 37 therein may again be formed as shown in FIGS. 4K and 4KS. In an example embodiment of the present invention, the first oxide layer 100 is first removed by a dry etching process and then the second sacrificial layer pattern 92 is removed by a wet etching process. When the first oxide layer 100 is removed, the first oxide channel regions 37a may not be removed because the first oxide channel regions 37a is disposed far from an upper face of the first oxide layer 100. The nanowire channel 37 in FIGS. 4O and 4OS-1 may have the first oxide channel region 37a at a central portion thereof, in contrast to the nanowire channels shown in FIGS. 4K and 4KS.

Referring to FIG. 4OS-2, surfaces of the nanowire channel 37, the preliminary channel layer pattern 32, the preliminary sacrificial layer pattern 22 and the semiconductor substrate 10, each of which may include silicon, may be oxidized to form a second oxide layer 110 using a second oxidization process. As described above, if the first oxide channel region 37a is not sufficiently formed in the nanowire channel 37 by the first oxidization process, the first oxide channel region 37a may be supplemented by forming the second oxide layer 110 in the second oxidization process.

Referring to FIGS. 4P and 4PS, a gate conductive layer 120 may be formed on the semiconductor substrate 10 to fill the seventh opening 57. The gate conductive layer 120 may be formed using, e.g., a metal nitride such as titanium nitride, tantalum nitride, etc., or a metal such as titanium, tantalum, etc. In an implementation, the gate conductive layer 120 may be formed using titanium nitride.

Referring to FIGS. 4Q and 4QS, the second mask 82, the second insulation layer pattern 72 and the mask pattern 44 may be removed, and the first insulation layer 60 may be partially removed to form a first insulation layer pattern 62. The second mask 82, the second insulation layer pattern 72, the mask pattern 44 and the first insulation layer 60 may be removed by, e.g., a wet etching process using an etching solution or a dry etching process using an etching gas.

Referring to FIGS. 4R, 4RS and 4RT, the first insulation layer pattern 62 may be removed by an etching process.

Referring to FIGS. 4S, 4SS-1 and 4ST-1, the gate conductive layer 120 may be partially removed to form a gate electrode 122 having a size smaller than that of the gate conductive layer 120. The gate conductive layer 120 may be removed by, e.g., a stripping process and/or an ashing process, or by a wet etching process. In an implementation, the stripping process may be performed using polyacrylonitrile (PAN). A portion of the second oxide layer 110 formed on the gate conductive layer 120 may also be removed to form a second oxide layer pattern 112. The second oxide layer pattern 112 may serve as a gate insulation layer.

A portion of the nanowire channel 37 covered by the gate conductive layer 120 may be outwardly exposed when the gate conductive layer 120 is partially removed. Additionally, the remaining preliminary channel layer pattern 32 and the gate electrode 122 may not make direct contact with each other.

Referring to FIGS. 4SS-2 and 4ST-2, surfaces of the nanowire channel 37, the preliminary channel layer pattern 32, the preliminary sacrificial layer pattern 22 and the semiconductor substrate 10, each of which may include silicon, may be oxidized so as to form a third oxide layer 130 by a third oxidization process, e.g., in which a heat treatment is performed under an oxygen atmosphere. The third oxide layer 130 may be further formed on a surface of the gate electrode 122 including a metal.

Additionally, a second oxide channel region 37b, insulating portions of the nanowire channel 37 from one another, may be formed at a portion of the nanowire channel 37 adjacent to a surface of the gate electrode 122. Thus, quantum dots 38, insulated from each other by the first and second oxide channel regions 37a and 37b, may be formed in the nanowire channel 37.

In an example embodiment, two quantum dots 38 are formed in the nanowire channel 37. In another embodiment, when the second sacrificial layer 90 is transformed into the second sacrificial layer pattern 92 by a dry etching process, some portions of the second sacrificial layer 90 may be etched much more than other portions, so that a plurality of the first oxide channel region 37a may be formed in the first oxidization process. Thus, more than two quantum dots 38 may be formed in the nanowire channel 37.

Referring to FIGS. 4T, 4TS and 4TT, impurities may be implanted into the preliminary channel layer pattern 32 to form source/drain layers 34, and thus a SET having quantum dots 38 in the nanowire channel 37 may be completed.

The SET illustrated in FIG. 2 may be completed by forming one nanowire channel 37 instead of forming two nanowire channels 37. Additionally, the SET illustrated in FIG. 3 may be formed by omitting the process for forming the first oxide channel region 37a.

As described above, example embodiments may provide a SET including a quantum dot having a predetermined size, e.g., several nanometers, and in a predetermined location. Thus, a GAA-type SET may be easily manufactured. A plurality of the quantum dots may be easily formed at desired locations in a nanowire channel. Thus, a SET having a good reliability may be easily manufactured, and the SET may operate with relatively low power consumption.

As described herein, when a layer or element is referred to as being "on" another layer or substrate, it can be directly on the other layer or substrate, or intervening layers may also be present. When a layer is referred to as being "under" another layer, it can be directly under, and one or more intervening layers may also be present. When a layer is referred to as being "between" two layers, it can be the only layer between the two layers, or one or more intervening layers may also be present. When an element or layer is referred to as being "connected" or "coupled" to another element or layer, it can be directly connected or coupled to the other element or layer, or intervening elements or layers may be present. In contrast, when an element is referred to as being "directly connected" or "directly coupled" to another element or layer, no intervening elements or layers are present.

As used herein, the term "and/or" includes any and all combinations of one or more of the associated listed items. Further, although terms such as "first," "second," "third," etc., may be used herein to describe various elements, components, regions, layers and/or sections, these elements, components, regions, layers and/or sections should not be limited by these terms. These terms are only used to distinguish one element, component, region, layer and/or section from another. Thus, a first element, component, region, layer and/or section could be termed a second element, component, region, layer and/or section without departing from the teachings of the embodiments described herein.

Spatially relative terms, such as "beneath," "below," "lower," "above," "upper," etc., may be used herein for ease of description to describe the relationship of one element or feature to another element(s) or feature(s), as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

As used herein, the singular forms "a," "an" and "the" are intended to include the plural forms as well, unless the context clearly indicates otherwise. It will be further understood that the terms "comprises," "comprising," "includes," and "including" specify the presence of stated features, integers, steps, operations, elements, components, etc., but do not preclude the presence or addition thereto of one or more other features, integers, steps, operations, elements, components, groups, etc.

Example embodiments are described herein with reference to cross-sectional illustrations that are schematic illustrations of idealized example embodiments and/or intermediate structures. As such, variations from the shapes of the illustrations, as a result, for example, of manufacturing techniques and/or tolerances, may be expected. Thus, the example embodiments described herein should not be construed as limited to the particular shapes of regions illustrated herein, and are to include deviations in shapes that result, for example, from manufacturing. For example, an implanted region illustrated as a rectangle may have rounded or curved features, and/or a gradient of implant concentration at its edges, rather than a binary change from an implanted to a non-implanted region. Likewise, a buried region formed by implantation may result in some implantation in the region between the buried region and the surface through which the implantation takes place. Thus, the regions illustrated in the figures are schematic in nature and their shapes may not illustrate the actual shape of the region, are not intended to limit the scope of the present invention to the exact shape illustrated.

Unless otherwise defined, all terms used herein, including technical and scientific terms, have the same meaning as commonly understood by one of ordinary skill in the art. It will be further understood that terms such as those defined in commonly used dictionaries should be interpreted as having a meaning that is consistent with their meaning in the context of the relevant art, and not in an idealized or overly formal sense unless expressly so defined herein.

Example embodiments have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A method of manufacturing a single electron transistor, comprising:
    forming source/drain layers disposed apart on a substrate and forming at least one nanowire channel connecting the source/drain layers;
    forming a sacrificial layer defining a space that overlaps a partial area of the nanowire chennel to select a location for a quantum dot in the nanowire channel;
    forming a plurality of oxide channel areas in the nanowire channel, at least one of the plurality of the oxide channel areas being formed through the space defined by the sacrificial layer and insulating at least one portion of the nanowire channel from an adjacent portion of the nanowire channel, and the quantum dot being in the at least one portion of the nanowire channel insulated from the adjacent portion of the nanowire channel by the at least one of the plurality of oxide channel areas; and
    forming a gate electrode that surrounds the quantum dot.

2. The method as claimed in claim 1, wherein:
    forming the plurality of oxide areas includes forming a first oxide channel area and forming a second oxide channel area, the first oxide channel area being surrounded by the gate electrode and being formed in the nanowire channel through the space defined by the sacrificial layer, and the second oxide channel area beding disposed adjacent to a first surface of the gate electrode, and
    the quantum dot is formed between the first and second oxide channel areas.

3. The method as claimed in claim 2, further comprising forming an oxide layer at the first surface of the gate electrode, such that the second oxide channel area is connected to the oxide layer.

4. The method as claimed in claim 2, wherein:
    the plurality of oxide channel areas includes a third oxide channel area disposed adjacent to a second surface of the gate electrode, the second surface being opposite the first surface of the gate electrode, and
    a plurality of quantum dots, at least certain of the plurality of quantum dots being between the first oxide channel area and the second oxide channel area or between the first oxide channel area and the third oxide channel area.

5. The method as claimed in claim 2, wherein
    forming the plurality of oxide channel areas includes forming an oxide layer on an extending portion of the nanowire channel between the second oxide channel area and an adjacent source/drain layer.

6. The method as claimed in claim 1, wherein the quantum dot is formed having a thickness of about 2 to about 5 nanometers.

7. The method as claimed in claim 6, wherein the quantum dot and the nanowire channel have a same thickness.

8. The method as claimed in claim 1,
    wherein forming the nanowire channel includes forming at least two nanowire channels that each connect the source/drain layers 9. The method as claimed in claim 8, wherein:
    each nanowire channel has at least one of the plurality of oxide channel areas disposed adjacent to a first side of the gate electrode,
    each nanowire channel is surrounded by an channel oxide layer, the channel oxide layer being surrounded by the gate electrode, and
    an oxide layer is formed at the first side of the gate electrode, the oxide layer being connected to each of the oxide channel areas adjacent to the first side of the gate electrode.

10. The method as claimed in claim 1, wherein forming the plurality of oxide channel areas includes oxidizing a portion of the nanowire channel adjacent to a surface of the gate electrode prior to an implanting of impurities on the source/drain layers to form a source/drain.

11. The method as claimed in claim 10, further comprising forming an oxide layer on the surface of the gate electrode, the oxide layer being connected to the plurality of oxidized channel areas of the nanowire channel.

12. The method as claimed in claim 1, wherein forming the plurality of oxide channel areas in the nanowire channel includes:
    forming a first oxide channel area in the nanowire channel such that the first oxide channel area is surrounded by the gate electrode and is formed through the space defined by the sacrificial layer; and
    forming a second oxide channel area in the nanowire channel adjacent to a surface of the gate electrode.

13. The method as claimed in claim 12, wherein forming the first oxide channel area includes, prior to forming the gate electrode:
    forming a first sacrificial material on the nanowire channel;
    partially etching the first sacrificial material to form a thinned portion of the first sacrificial material to effect the forming of the sacrificial layer;
    oxidizing a portion of the nanowire channel that corresponds to the thinned portion of the first sacrificial material; and
    removing the first sacrificial material from the nanowire channel after the oxidizing.

14. The method as claimed in claim 13, further comprising, after removing the first sacrificial material, oxidizing a surface of the nanowire channel to form an oxide layer thereon with an oxidized surface, such that, after forming the gate electrode, the oxidized surface of the nanowire channel is between the nanowire channel and the gate electrode.

15. The method as claimed in claim 12, wherein forming the second oxide channel area includes:
    forming an oxide layer at a surface of the gate electrode, and
    oxidizing a portion of the nanowire channel, wherein the oxidized portion of the nanowire channel is connected to the oxide layer.

16. The method as claimed in claim 1, wherein forming the nanowire channel comprises:
    forming a sacrificial layer on the substrate;
    forming a channel layer on the sacrificial layer;
    partially removing the channel layer and the sacrificial layer to form the nanowire channel, the source/drain layers, a first sacrificial layer pattern beneath the nanowire channel, and a pair of second sacrificial layer patterns beneath the source/drain layers, wherein the second sacrificial layer patterns are disposed apart from each other and are connected by the first sacrificial layer pattern, and the source/drain layers are connected by the nanowire channel; and
    removing the first sacrificial layer pattern from beneath the nanowire channel.

17. The method as claimed in claim 16, wherein the channel layer includes single crystalline silicon, and the sacrificial layer includes silicon germanium.

18. The method as claimed in claim 1, wherein:
    the nanowire channel is surrounded by a channel oxide layer, and
    forming the gate electrode includes:
        surrounding the nanowire channel between the source/drain layers with a gate conductive layer; and partially removing the gate conductive layer to form the gate electrode, the gate electrode being disposed apart from the source/drain layers, and the channel oxide layer being between the nanowire channel and the gate electrode.

19. The method as claimed in claim 1, wherein the plurality of oxide channel areas are spaced apart within the nanowire channel.

20. A method of manufacturing a single electron transistor, comprising:
   forming source/drain layers disposed apart on a substrate and forming at least one nanowire channel connecting the source/drain layers;
   forming a sacrifical layer definging a space that overlaps a partial area of the nanowire channel to select a location for a quantum dot in the nanowire channel;
   forming a plurality of oxide channel areas in the nanowire channel, at least one of the oxide channel areas being formed in the nanowire channel through the space defined by the sacrificial layer and insulating at least one portion of the nanowire channel, and the quantum dot being in the at least one portion of the nanowire channel insulated by the at least one of the oxide channel areas; and
   forming a gate electrode that surrounds the quantum dot, wherein:
   prior to forming the gate electrode, the forming of the at least one of the oxide channel areas includes:
      forming a first sacrificial material on the nanowire channel;
      partially etching the first sacrificial material to form a thinned portion of the first sacrificial material to effect the forming of the sacrificial layer;
      oxidizing a portion of the nanowire channel that corresponds to the thinned portion of the first sacrificial material; and
      removing the first sacrificial material from the nanowire channel after the oxidizing.

* * * * *